United States Patent [19]
Prengle et al.

[11] Patent Number: 5,171,702
[45] Date of Patent: Dec. 15, 1992

[54] METHOD FOR FORMING A THICK BASE OXIDE IN A BICMOS PROCESS

[75] Inventors: Scott H. Prengle; Robert H. Eklund, both of Plano, Tex.

[73] Assignee: Texas Instruments Incorporated, Dallas, Tex.

[21] Appl. No.: 785,174

[22] Filed: Oct. 29, 1991

Related U.S. Application Data

[63] Continuation of Ser. No. 383,960, Jul. 21, 1989, abandoned.

[51] Int. Cl.$^5$ .......................................... H01L 21/72
[52] U.S. Cl. ........................................ 437/59; 437/56; 437/28; 437/33; 437/979; 148/DIG. 9
[58] Field of Search .................. 437/28, 33, 56, 59, 437/979; 148/DIG. 9

[56] References Cited

U.S. PATENT DOCUMENTS

| | | | |
|---|---|---|---|
| 4,346,512 | 8/1982 | Ciang et al. | 437/59 |
| 4,475,279 | 10/1984 | Gahle | 437/59 |
| 4,503,603 | 3/1985 | Blossfeld | 29/571 |
| 4,529,456 | 7/1985 | Anzai et al. | 148/186 |
| 4,616,405 | 10/1986 | Yasuoka | 29/578 |
| 4,678,936 | 7/1987 | Holloway | 307/303 |
| 4,707,456 | 11/1987 | Thomas et al. | 437/59 |
| 4,710,791 | 12/1987 | Shirato et al. | 357/23.13 |
| 4,737,472 | 4/1988 | Schaber et al. | 437/59 |
| 4,752,589 | 6/1988 | Schaber | 437/31 |
| 4,808,548 | 2/1989 | Thomas et al. | 148/DIG. 9 |
| 4,816,423 | 3/1989 | Havemann | 437/31 |
| 4,818,720 | 4/1989 | Iwasaki | 437/59 |
| 4,859,630 | 8/1989 | Josquin | 437/59 |
| 4,877,748 | 10/1989 | Havemann | 437/59 |
| 4,908,324 | 3/1990 | Nihira et al. | 437/31 |
| 4,931,407 | 6/1990 | Maeda et al. | 437/59 |
| 4,965,220 | 10/1990 | Iwasaki | 437/59 |

FOREIGN PATENT DOCUMENTS

| | | |
|---|---|---|
| 0283135 | 9/1988 | European Pat. Off. . |
| 0320217 | 6/1989 | European Pat. Off. . |
| 3527098 | 1/1987 | Fed. Rep. of Germany ........ 437/24 |
| 62-98663 | 10/1987 | Japan . |

OTHER PUBLICATIONS

Ikeda, et al., "High Speed BiCMOS Technology with a Buried Twin Well Structure," *IEEE Trans. Elec. Dev.* vol. ED-34, No. 6 (Jun. 1987), pp. 1304–1309.
Chang, I., "FET-Bipolar Integration", *IBM Technical Disclosure Bulletin*, vol. 14, No. 1, Jun. 1971.

*Primary Examiner*—Olik Chaudhuri
*Assistant Examiner*—G. Fourson
*Attorney, Agent, or Firm*—Stanton C. Braden; Rene' E. Grossman; Richard L. Donaldson

[57] ABSTRACT

A BiCMOS structure and a method for making the same is disclosed, where the dielectric layer between the emitter electrode and the base region is formed of a deposited dielectric. After definition of the bipolar and MOS moat regions, a layer of polysilicon is deposited thereover, and removed from the bipolar region. The base implant is performed either prior to or after the etch of the polysilicon layer. A layer of TEOS oxide is formed thereover and is etched to remain in portions of the bipolar region, with an emitter contact formed therethrough and a portion of the bipolar region exposed at which the extrinsic base is formed. An alternative embodiment of the invention includes scaling the emitter contact by forming sidewall oxide filaments therewithin. A second layer of polysilicon is disposed thereover to form the emitter electrode, and to merge with the first layer to form the gates of the MOS transistors. Subsequent patterning and etching of the polysilicon, followed by sidewall filament formation and source/drain doping, is performed to complete the structure.

15 Claims, 5 Drawing Sheets

METHOD FOR FORMING A THICK BASE OXIDE IN A BICMOS PROCESS

This application is a continuation of application Ser. No. 07/383,960 filed Jul. 21, 1989 now abandoned.

This invention is in the field of integrated circuits, and is specifically directed to methods of fabricating bipolar and CMOS transistors in the same integrated circuit.

BACKGROUND OF THE INVENTION

As is well known in the art, digital and linear functions are often performed by integrated circuits using either bipolar or metal-oxide-semiconductor (MOS) technology. Bipolar integrated circuits, of course, provide higher speed operation and greater drive currents than the MOS circuits, at the cost of higher power dissipation, especially when compared against complementary MOS (CMOS) circuits. Recent advantages in manufacturing technology have allowed the use of both bipolar and CMOS transistors in the same integrated circuit (commonly referred to as BiCMOS devices). Examples of BiCMOS structures and methods for making the same are described in copending application Ser. No. 008,910, filed Jan. 30, 1987, now abandoned, and applications Ser. No. 129,261 filed Dec. 7, 1987, now abandoned, and Ser. No. 366,224 filed Jun. 12, 1989 now U.S. Pat. No. 4,958,213 which is a continuation of application Ser. No. 129,271 filed Dec. 7, 1987 (now abandoned), all assigned to Texas Instruments Incorporated.

The formation of BiCMOS devices may of course be accomplished by forming the bipolar transistors according to known techniques in selected areas of the device, by forming the MOS transistors according to known techniques in selected areas of the device, and interconnecting the two types of transistors. However, certain features of each type of transistor tend to be incompatible, from a process standpoint, with the other type, requiring a large number of process steps to form each. It is therefore preferable in the manufacture of such BiCMOS circuits to utilize structures which are useful in both types of transistors, in order to minimize the process complexity and cost. Such dual utilization of structural components and process steps, however, generally results in a process which is less than optimal for either the bipolar or the MOS transistors, or both.

Prior methods for forming the bipolar transistors in such structures, such as described in said application Ser. No. 008,910, have incorporated thin oxide layers between the diffused base region and the overlying emitter electrode (generally formed of polysilicon). The thin oxide over the base is generally formed in the same step as the gate oxide for the MOS transistors, and therefore is generally of a thickness on the order of 20 nm.

Such thin oxides separating the base region from the emitter electrode cause certain problems, however. Firstly, performance of the bipolar transistors degrades as the emitter-to-base capacitance increases. Of course, such capacitance increases as the dielectric thickness therebetween decreases, making it preferable to have a thicker dielectric between the emitter and the base region. In addition, a thin dielectric between the emitter electrode and the base region is inherently weaker to stress from subsequent processing steps such as contact etch, silicidation, and metal deposition and sinter. Furthermore, a thin dielectric also increases the risk that a contact via formed over the oxide for connecting an overlying metallization layer to the emitter electrode will leak to the base region. This can occur in the event that the contact via is overetched through the emitter electrode, in which case the dielectric under the emitter electrode will be further thinned, in turn further increasing the emitter-to-base capacitance. In extreme cases, the dielectric may be etched completely through, shorting the overlying metal and the emitter electrode to the base region.

The method described in the above-referenced application Ser. No. 008,910, using the thin MOS gate oxide thin dielectric over the base region, avoids the stress and overetch problems by making contact to the polysilicon emitter electrode at a location away from the contact to the base region. Such a configuration does not address the emitter-to-base capacitance problem, and adds the disadvantage of increasing the emitter resistance.

The method described in said copending application Ser. No. 366,224, now U.S. Pat. No. 4,958,213, describes the formation of a bipolar transistor in a BiCMOS process where the same polysilicon layer is used to form the emitter and gate electrodes, but where a thicker base oxide is provided under the emitter electrode than under the gate electrodes. This is accomplished by placing a material which inhibits oxidation, such as silicon nitride, over the regions where the MOS transistors are to be formed but not over the base region. A thermal oxide is then formed over the base region to the desired thickness, and the intrinsic base region implant is performed with the nitride over the non-base regions masking the implant thereat. The nitride oxidation mask is removed from the MOS regions, and a contact is etched through the base oxide for the emitter contact. The structure is completed by deposition of polysilicon, followed by conventional source/drain and extrinsic base implant and diffusion steps.

This method of application Ser. No. 366,224 is effective to form an oxide layer under the emitter electrode which is thicker than the gate oxide of the MOS transistors, and which therefore provides for reduced emitter-base capacitance and allows emitter contacts to be nested within the base region. It is desirable, however, to improve a number of facets of this process. Firstly, it is desirable to reduce high temperature processing after dopant has been implanted for formation of the base region, in order to maintain minimal depth of diffused regions as the size of the structures are scaled to smaller geometries. Secondly, it is desirable to control the thickness of the oxide over the base region independently from other structures on the surface of the wafer, such as diffused regions. Thirdly, it is desirable to simplify the process for forming the bipolar transistor in a BiCMOS structure. Fourthly, it is desirable to allow for the scaling of the emitter contact through the base oxide in a manner which does not depend upon lithographically defining the contact opening.

It is therefore an object of this invention to provide a process for forming a BiCMOS structure which incorporates a deposited dielectric layer between the base and emitter of the bipolar transistors in conjunction with a thermal oxide under the gate of the MOS devices.

It is yet another object of this invention to provide such a process which provides such a thicker dielectric with reduced thermal processing after the formation of the intrinsic base region.

It is yet another object of this invention to provide such a process which provides for independent control of the base oxide relative to other structures such as diffusion depths.

It is yet another object of this invention to provide such a process which is relatively simple in the number of processing steps.

It is yet another object of this invention to provide such a method where the emitter contact can be non-lithographically defined so that the structure can be scaled to smaller physical dimensions.

Other objects and advantages of the invention will be apparent to those of ordinary skill in the art having reference to the following specification in conjunction with the drawings.

SUMMARY OF THE INVENTION

The invention may be incorporated into a method for fabricating a semiconductor device, by defining the base region of a bipolar transistor by removing from the surface thereof the layer of polysilicon used to form the gate electrodes of MOS devices at the same surface. The base region can be implanted to the desired impurity concentration either prior to or after the removal of the polysilicon. A deposited dielectric, such as silicon dioxide formed from the decomposition of TEOS, is then formed over the base region to the desired thickness. The deposited dielectric is then removed from the locations other than the intrinsic base region, to form the emitter contact. A second polysilicon layer is formed thereover to form the emitter electrode, and to merge with the first layer at the MOS locations. The gates of the MOS transistor and the emitter electrode are then lithographically defined and etched, and the source/drain regions, collector contact and extrinsic base regions are then formed in the conventional manner.

DETAILED DESCRIPTION OF THE PREFERRED EMBODIMENTS

Figure 1:
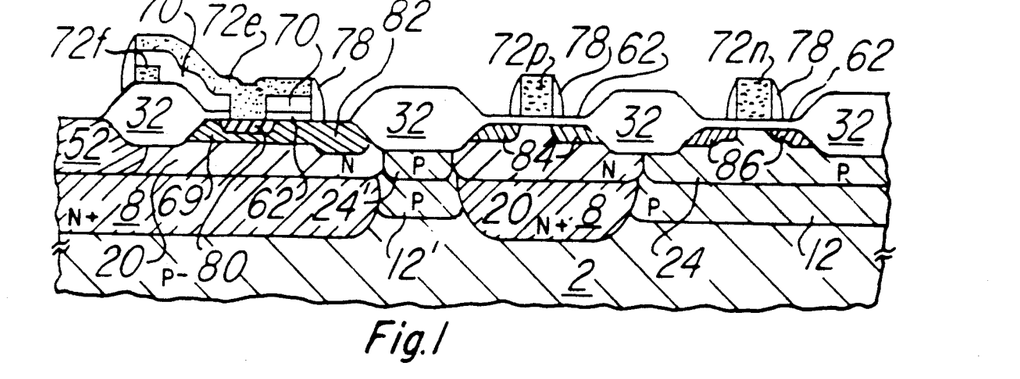
FIG. 1 is a cross-sectional view of a BiCMOS semiconductor structure according to a first preferred embodiment of the invention.

Referring to FIG. 1, the BiCMOS semiconductor structure according to the preferred embodiment of the invention will be described. While this structure includes both bipolar and MOS transistors, and while the following description will be made with reference to the formation of both bipolar and MOS transistors, it should be noted that benefits can also be obtained in the fabrication of an integrated circuit having only bipolar transistors according to the instant invention.

Figure 3:
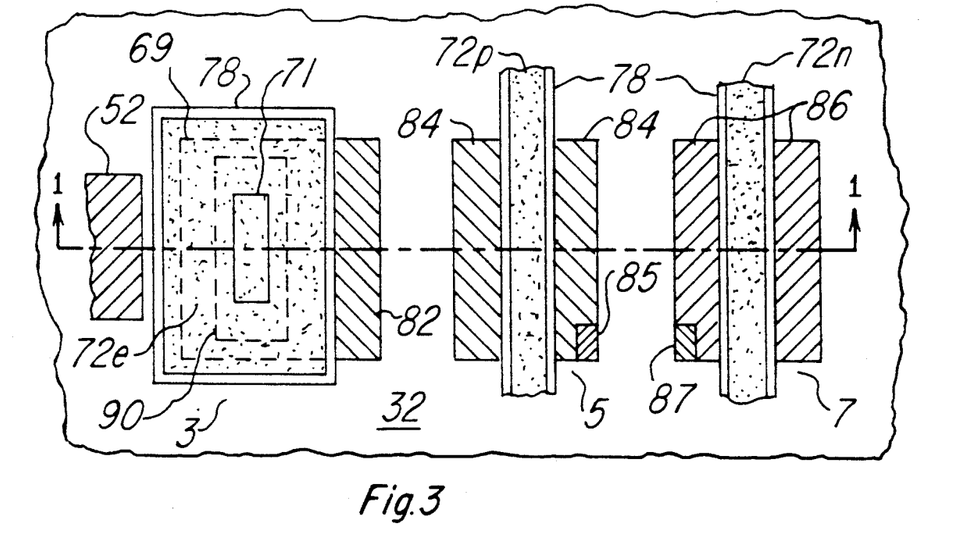
FIG. 3 is a plan view of the BiCMOS semiconductor structure of FIG. 1.

FIG. 1 illustrates, in cross-section, bipolar transistor 3, p-channel MOS transistor 5 and n-channel MOS transistor 7. FIG. 3 is a plan view of transistors 3, 5, and 7 of FIG. 1. The structure is formed into substrate 2 which, in this embodiment is p-type silicon. Buried n+ region 8 in bipolar transistor 3 serves as a sub-collector, in the conventional manner, with n+ region 52 providing a surface contact thereto. N region 20 in bipolar transistor 3 is the collector region thereof, and is disposed over buried n+ region 8. As will be described hereinbelow, n region 20 is formed in an epitaxial layer grown over substrate 2 after the implantation of dopant for forming buried n+ region 8. Intrinsic base 69 is a p-type region disposed within n region 20 in bipolar transistor 3, and emitter region 80 is an n-type region disposed within intrinsic base region 69. Intrinsic base region 69 is isolated from diffused collector contact 52 by field oxide 32. Emitter region 80 is, in this embodiment, formed by the diffusion of n-type dopant from polysilicon emitter electrode 72e in the conventional manner. Extrinsic base region 82 is a p-type region which is more heavily doped than intrinsic base region 69. As is well known in the art, extrinsic base region 82 provides a relatively low series resistance contact from the surface of the structure to intrinsic base region 69.

P-channel MOS transistor 5 is formed into n-type region 20, which is disposed over buried n+ region 8 in the same manner as for bipolar transistor 3. The use of similar n-type regions 20 both as the collector region for bipolar transistor 3 and for the n-well for p-channel MOS transistor 5 provides for efficiency in the manufacture of the structure. The provision of n+ region 8 under n-well 20 in MOS transistor 5 is useful to provide a constant bias throughout n-well 20, thereby reducing the tendency of the structure to enter a latchup condition. Referring to FIG. 3, an n+ diffusion region 85 may be provided within n-well 20 to make contact to buried n+ region 8 from the surface, in a similar manner as collector contact 52, as described in said copending application Ser. No. 366,224. Such contact is useful in biasing the n-well 20 to the same potential as the source of the transistor.

Gate electrode 72p is disposed over n-well 20, and is insulated therefrom by gate oxide 62. P-type source/drain regions 84 are disposed in self-aligned manner to gate electrode 72p (with sidewall oxide filaments 78 disposed along the sides thereof), in the conventional manner. For purposes of efficiency in the manufacture of the structure, p-type source/drain regions 84 may be formed by the same ion implantation (and subsequent diffusion) as used for the formation of extrinsic base region 82 in bipolar transistor 3.

N-channel MOS transistor 7 is similarly constructed as p-channel MOS transistor 5, but of course with opposite conductivity type doped regions. Buried p region 12 is formed into substrate 2, in a manner similar to the formation of buried n+ regions 8 for bipolar transistor 3 and p-channel MOS transistor 5. While the buried p region 12 is optional for purposes of forming an operable circuit, as described in said copending application Ser. No. 366,224, the provision of buried p region 12 allows for reduced latchup sensitivity of the structure. P-well 24 is formed into the epitaxial layer over substrate 2 in a similar manner as n-type regions 20, and is lightly doped relative to buried p region 12. Referring to FIG. 3, p-type well contact region 87 may be provided, if desired, to establish the potential of p-well 24 at that of the source of n-channel MOS transistor 7.

Polysilicon gate electrode 72n is disposed over p-well 24, and insulated therefrom by gate dielectric 62. N-type source/drain regions 86 are formed in a self-aligned manner relative to gate electrode 72n and sidewall oxide filaments 78 formed thereupon. In this embodiment, n-channel MOS transistor 7 includes lightly-doped drain extensions to form a graded junction, for example as described in U.S. Pat. No. 4,356,623 issued Nov. 2, 1982, and U.S. Pat. No. 4,566,175 issued Jan. 28, 1986, both assigned to Texas Instruments Incorporated. It should of course be understood that n-channel MOS transistor 7 may alternatively be formed with abrupt junctions, if desired. It should also be noted that other materials from which dopant may diffuse may be used as emitter electrode 72e and gate electrodes 72n and 72p, including, for example, amorphous silicon and deposited refractory metal silicides, such as molybdenum, tungsten, or titanium silicide.

Transistors 3, 5 and 7 are isolated from one another by field oxide structures 32. The n-type regions 20 (and buried n+ regions 8) of bipolar transistor 3 and p-channel MOS transistor 5 are isolated from one another by buried p region 12′ underlying p region 24′, both of which are disposed under a field oxide structure 32. In this way, the n-type regions 20 of the two transistors may be at different potentials. Relative to isolation between MOS transistors 5 and 7 of different conductivity type, junction isolation provided by a reversed biased p-n junction between buried n+ region 8 and buried p region 12, as well as between n-well 20 and p-well 24 where the junction underlies field oxide 32, is sufficient provided that proper bias is established in the wells relative to one another. It should of course be noted that alternative methods of isolation, for example the trench isolation schemes described in U.S. Pat. No. 4,631,803 issued Dec. 30, 1986, and U.S. Pat. No. 4,835,115 issued May 30, 1989, both assigned to Texas Instruments Incorporated, are equivalently applicable to this embodiment of the invention.

The structure according to the instant invention includes a dielectric layer 70 underlying emitter electrode 72e. Dielectric layer 70 is substantially thicker than gate dielectric 62 underlying the gates 72p and 72n of MOS transistors 5 and 7. For example, gate dielectric 62 may be made up of thermal silicon dioxide having a thickness on the order of 10 to 30 nm, while dielectric layer 70 may be on the order of 75 to 150 nm thick. Dielectric layer 70 is preferably a deposited dielectric such as silicon dioxide deposited by way of LPCVD.

Preferably, gate dielectric 62 is also present in bipolar transistor 3 over intrinsic base region 69, and underlying dielectric layer 70. Gate dielectric 62 in this location protects the silicon surface of intrinsic base region 69 from contamination which may be present in deposited dielectric layer 70, both during and after its deposition. Of course, it is also preferable to leave gate dielectric 62 in this location so that an additional oxide removal step is not required.

As described above, sidewall oxide filaments 78 are provided on the sides of the gate electrodes 72p and 72n for the MOS transistors, and also on the side of the stack consisting of emitter electrode 72e and dielectric layer 70 for bipolar transistor 3. As will be described in detail hereinbelow, the preferred embodiment of the method for forming the structure of FIG. 1 may result in a polysilicon filament 72f along the side of dielectric layer 70 overlying field oxide 32; a sidewall oxide filament 78 passivates this filament 72f so that its presence is harmless to the functionality and reliability of the structure of FIG. 1. It should of course be noted that materials other than silicon dioxide may be used as sidewall filaments 78, such materials including silicon nitride and undoped polycrystalline silicon. It should be noted, however, that it is preferable that the sidewall filaments be of a material other than silicon, especially if self-aligned silicidation of the surface regions (such as collector contact 52, extrinsic base 82, and source/drain regions 84 and 86) and the polysilicon structures 72e, 72p and 72n is to be performed, for example as described in U.S. Pat. No. 4,384,301 issued May 17, 1983, and assigned to Texas Instruments Incorporated.

The provision of thick dielectric layer 70 underlying emitter electrode 72e provides advantages in the resulting structure. Firstly, the thickness of dielectric layer 70 provides for reduced emitter-base capacitance, relative to what this parasitic capacitance would be if a thinner dielectric, such as on the order of gate dielectric 62, were used under emitter electrode 72e. This is, of course, due to the inversely proportional relationship of capacitance to dielectric thickness, making it preferable to have a thicker dielectric between the emitter electrode and the base region in order to reduce such capacitance.

Secondly, the thick dielectric layer 70 allows for contact to emitter electrode 72e to be made by metal or other material directly over the emitter region, for example at location 90 illustrated in FIG. 3. With a thinner dielectric, such contact is generally prohibited as the etching of the contact directly over the emitter, as such a thin dielectric is inherently weaker to stress from subsequent processing steps such as contact etch, and metal deposition and sinter. The effect of such stress degrading the dielectric between the emitter and base is electrical leakage therebetween. Such leakage will especially be a problem in the event that the contact via is overetched through the emitter electrode, in which case the dielectric under the emitter electrode will be further thinned, in turn further increasing the emitter-to-base capacitance. In extreme cases, the dielectric may be etched completely through, shorting the overlying metal and the emitter electrode to the base region. If a thin dielectric such as on the order of gate dielectric 62 is placed under emitter electrode 72e, the metal contact to emitter electrode 72e will need to be located away from the emitter region 80, for example at a location over field oxide 32 in order to avoid such problems. Such contacting of emitter electrode 72e thus requires that the size of the transistor 3 is increased, limiting the density of the integrated circuit. The provision of a relatively thick dielectric layer 70 under emitter electrode 72e allows for the contact to be placed directly over emitter region 80 without the problems described hereinabove.

Said copending application Ser. No. 366,224 describes a method where a thermally grown oxide which is thicker than the MOS gate dielectric is formed over the base region, directed toward solution of the above-noted problems. It has been found that a deposited dielectric layer 70 of the instant invention can provide further benefit over a thermal base oxide. For example, for a given rate of formation, silicon dioxide may be deposited at a lower temperature than that at which it can be thermally grown. Such reduced temperature allows for reduced diffusion (both in depth and laterally) of dopant in the structure at the time of the deposition. With the current trend toward shallower diffusion depths, and sub-micron lateral spacing, tighter control of the diffusion of dopant is much desired. Furthermore, also due to the low temperature processing, the thickness of dielectric layer 70 can be optimized independently from such other variables as diffusion of dopant. In addition, it is well known from conventional local oxidation (LOCOS) processing that a thermally grown oxide can form the well-known bird's beak and bird's head at the interface between the oxide and an oxidation mask (such as silicon nitride). Such artifacts of oxidation can be reduced by reducing the thickness of the oxide which is thermally grown. A deposited dielectric layer 70 can, however, be deposited to the desired thickness without concern for such artifacts, since no silicon is consumed during deposition which would cause stress at the corners of the masking layer.

Figure 2A:
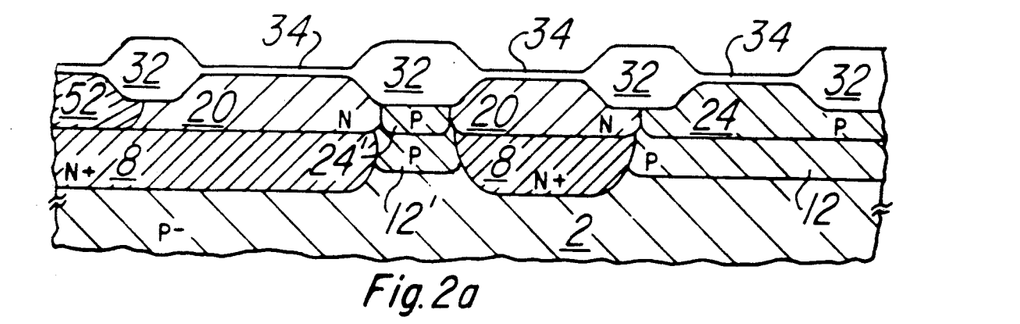
FIGS. 2a through 2j are cross-sectional views of the BiCMOS semiconductor structure of FIG. 1 illustrating various states of its fabrication.

Referring now to FIGS. 2a through 2j, a method for fabricating the structure according to the invention will be described in detail. Examples of forming the structure of FIG. 2a are described in said copending application Ser. No. 366,224 filed Dec. 7, 1987, and copending application Ser. No. 265,074 filed Oct. 31, 1988, now abandoned, both assigned to Texas Instruments Incorporated and both incorporated herein by this reference. In summary, buried n+ regions 8 and buried p regions 12 (and 12') are formed by masked ion implantation into substrate 2, after which an epitaxial layer is formed thereover. It is preferable that the epitaxial layer is relatively lightly-doped, as described in said application Ser. No. 366,224, so that the p-well 24 into which the n-channel MOS transistor 5 is to be formed does not have to substantially counterdope n-type material; such counterdoping has been found to adversely impact the carrier mobility in the channel of the transistor. However, a heavier doped epitaxial layer may be formed thereover, if a single well implant is desired (with the epitaxial layer serving as the well for the opposite conductivity type MOS transistors). Masked implants are then performed, followed by annealing, to form n-type regions 20 and p-type regions 24 (and 24'). Ion implantation and annealing can be performed in order to form deep n+ collector contact region 52, as described in said application Ser. No. 366,224, if desired.

Field oxide regions 32 are then formed by way of conventional field oxide formation techniques such as LOCOS. U.S. Pat. No. 4,541,167 issued Sep. 17, 1985, and assigned to Texas Instruments Incorporated, describes a particularly beneficial method for forming LOCOS structures using a polysilicon buffer layer in the oxidation mask. Other isolation techniques, such as the afore-mentioned trench isolation structures, or recessed isolation oxide methods, such as described in U.S. Pat. No. 4,580,330 issued Apr. 8, 1986 and assigned to Texas Instruments Incorporated, may alternatively be used for the formation of such isolation structures. For purposes of explanation, conventional field oxide structures 32 are used in this embodiment of the invention.

Figure 2B:
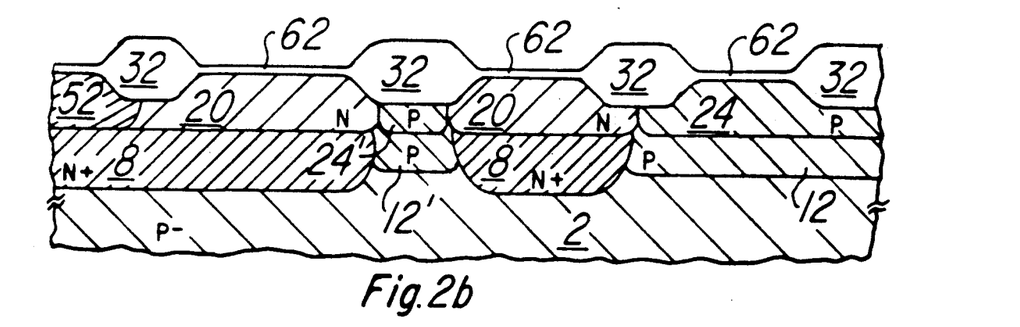
Figure 2C:
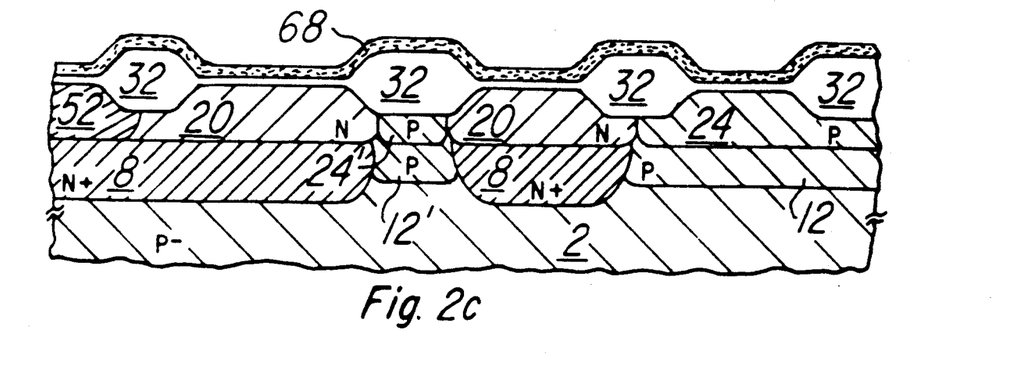

Disposed over the moat regions of the surface of the structure in FIG. 2a (moat regions defined as those portions of the surface at which field oxide 32 is not present, such regions to be the locations at which active devices are to be formed) is dummy gate oxide 34. As is conventional in the art, dummy gate oxide 34 is provided so that ion implantation, such as may be desired for adjusting the threshold voltages of the MOS transistors, will not "channel" to an undesired and uncontrollable depth into the moat regions. Dummy gate oxide 34 is referred to as "dummy", since it will be removed by way of a deglaze after the $V_t$ adjust implant and replaced with gate dielectric 62, as shown in FIG. 2b.

Gate dielectric 62 is formed of conventional material of conventional thicknesses for MOS transistors. For example, in this embodiment gate dielectric may be formed of thermal silicon dioxide of a thickness in the range of 10 nm to 30 nm. Other conventional dielectric material such as deposited silicon nitride may be used as gate dielectric 62, or further in the alternative may be formed of a stack of dielectric material, such as a stacked layer of oxide/nitride/oxide.

Following formation of gate dielectric 62, a layer of polycrystalline silicon 68 is deposited by way of CVD over the surface of the structure. This layer may be doped in-situ during deposition, or as will be described hereinbelow, may be doped by way of a blanket or masked ion implantation. Polysilicon layer 68 in this embodiment is of a thickness on the order of 100 to 200 nm, resulting in the structure of FIG. 2c.

Figure 2D:
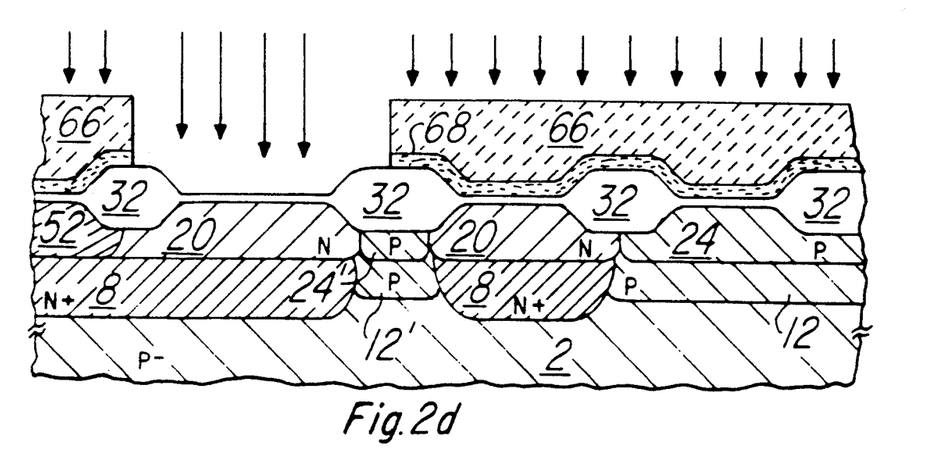

Masking layer 66, for example a layer of photoresist, is placed over the structure, and photolithographically patterned and developed to expose the portion of the structure at which the base of bipolar transistor 3 is to be formed (i.e., including both intrinsic base 69 and extrinsic base 82 of FIG. 1). The moat regions at which both types of MOS transistors 5 and 7 are to be formed are protected by masking layer 66, as is the collector contact region 52, as shown in FIG. 2d. With masking layer 66 in place, polysilicon layer 68 is etched from the location at which intrinsic base 69 and extrinsic base 82 will be located. Conventional wet or dry polysilicon etches may be used; a preferred example of a dry polysilicon etch is described in U.S. Pat. No. 4,502,915 issued Mar. 5, 1985, and assigned to Texas Instruments Incorporated.

Ion implantation of boron is then performed in order to dope the portion of n region 20 with the intrinsic base implant, as shown in FIG. 2d. It should be noted that, in this embodiment, the intrinsic base implant is performed after polysilicon layer 68 has been etched from the moat region in bipolar transistor 3, through gate dielectric 62 only. Alternatively, the intrinsic base implant also can be performed prior to the etch of polysilicon layer 68 in the bipolar region, through both gate dielectric 62 and polysilicon layer 68. The implant dose and energy can be determined by one of ordinary skill in the art to arrive at the desired impurity concentration in the base of the desired bipolar transistor 3. In this preferred embodiment, where the intrinsic base implant is performed through gate dielectric 62 only, after etch of polysilicon 68 thereover, a base implant of boron of a dose of 7.0E13 cm$^{-2}$ at an energy of 10 keV, is performed, where the n-well impurity concentration is on the order of 4E16 cm$^{-3}$ at the surface. In the alternative, where approximately 125 nm of polysilicon layer 68 remains over the bipolar moat region at the time of the base implant, an example of an intrinsic base implant would be a boron implant of a dose of 5.8E13 at an energy of 40 keV.

Figure 2E:
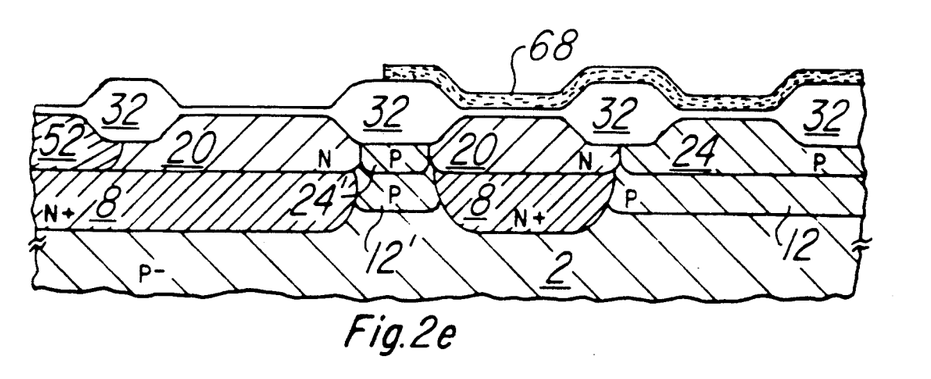
Figure 2F:
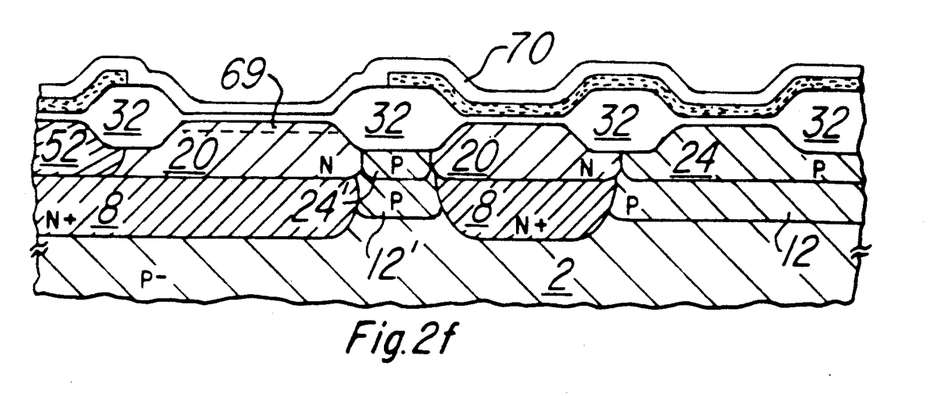

After the etch of polysilicon layer 68, masking layer 66 is removed from the structure. The result is shown in FIG. 2e, showing the implanted boron 69 which will eventually form the intrinsic base region of bipolar transistor 3. A dielectric layer 70 is then deposited overall, as shown in FIG. 2f. Dielectric layer 70 may be any conventional dielectric material, but preferably is silicon dioxide which is deposited by way of decomposition of tetraethyl orthosilicate (TEOS), preferably under LPCVD conditions, in the conventional manner. As mentioned above, it is preferable for gate dielectric 62 to remain over the bipolar region and to have dielectric layer 70 deposited thereover, not only so that an additional oxide removal step need not be performed, but also so that the silicon surface of the bipolar region remains protected from contaminants which may be present in dielectric layer 70, or present during the deposition thereof. Dielectric layer 70 (and gate dielectric 62 thereunder) will serve as the dielectric between the emitter electrode 72e and the intrinsic base region 69, as shown in FIG. 1. Accordingly, dielectric layer 70 is to be deposited to the thickness desired for such a structure in order to minimize parasitic emitter-base capacitance and provide the necessary film integrity to place a metal contact to emitter electrode 72e directly thereover, if desired. In this embodiment, the thickness of dielectric layer 70 is is on the order of 50 to 150 nm.

As mentioned hereinabove, one of the benefits of the instant invention is that the thickness of dielectric layer 70 can be controlled independently relative to other process variables, such as depth of intrinsic base 69. As is well known, an important parameter in the performance of a bipolar transistor is the base width. In a vertical bipolar transistor 3 such as that of FIG. 1, the base width is determined by the depth of the intrinsic base. It is therefore important that the diffusion of the implanted dopant 69 of FIG. 2f (which will result in intrinsic base region 69) be well controlled in order to optimize the base width of the transistor 3, and its performance. The use of a deposited dielectric layer 70 as described above can be done at temperatures which are relatively low relative to those of thermal oxidation; for example, LPCVD of silicon dioxide by TEOS decomposition can be done at temperatures in the range of 650 to 750 degrees Celsius. Such low temperatures will diffuse the implanted boron 69 only minimally, allowing control of the depth of the intrinsic base region with a single anneal step later in the process. Since diffusion of the implanted base dopant is minimal during LPCVD of dielectric layer 70, the thickness of dielectric layer 70 can be optimized for film strength and for reduction of the parasitic capacitance, without limiting the film thickness due to thermal considerations.

Additional control of the base width is provided according to the instant invention, considering that the intrinsic base implant is performed after formation of gate dielectric 62, whether before or after the etch of polysilicon layer 68. This further reduces uncontrolled diffusion of the implanted base dopant, as the dopant is not present during the thermal oxidation process conventionally used to form gate dielectric 62. Furthermore, in either of the above alternatives, the intrinsic base implant is performed through relatively thin gate dielectric 62, which is generally well-controlled since it is generally thermally grown oxide. Accordingly, the method of the invention provides still further control of the base width relative to prior methods which implant the intrinsic base through a thicker oxide on the order of 140 nm, since variations in such thicker oxide layers have a more significant impact on the profile of the dopant implanted therethrough.

Figure 2G:
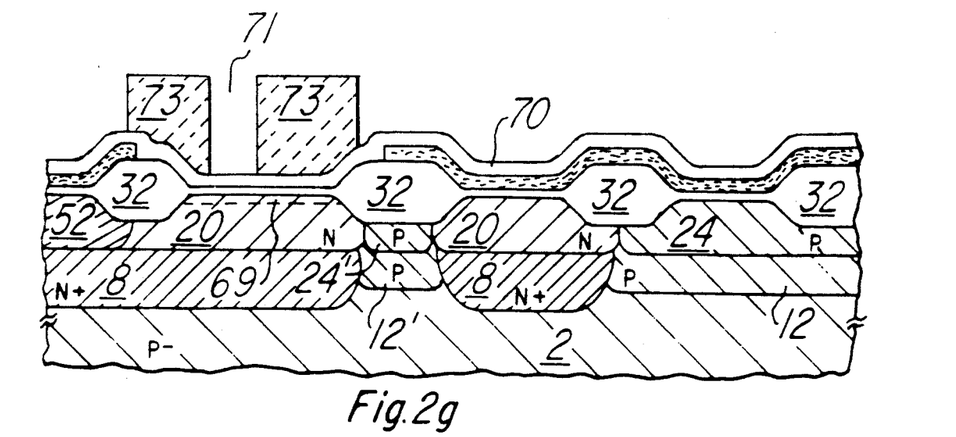

Referring now to FIG. 2g, another masking layer 73 of photoresist is illustrated as present over dielectric layer 70. Masking layer 73 is lithographically exposed and subsequently developed so that it protects dielectric layer 70 at locations at which the eventual emitter electrode 72e is to overlap intrinsic base region 69. It should be noted that opening 71 is defined, at which the emitter region will be formed. A portion of dielectric layer 70 is also protected at location 74 over intrinsic base region 69 where extrinsic base region 82 will eventually be formed, so that the polysilicon etch used in the formation of the gate and emitter electrodes 72 will not etch into the single crystal silicon thereat.

Figure 2H:
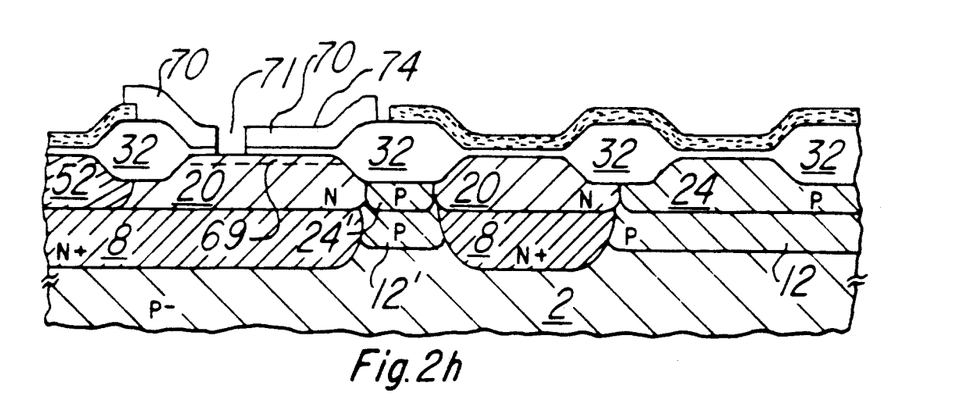

FIG. 2h illustrates the structure after an oxide etch is performed to remove dielectric layer 70 from the locations not protected by masking layer 72, and after removal of masking layer 72. It is preferable to use an etch which selectively etches silicon dioxide relative to silicon so that the remaining portions of polysilicon layer 68 and of n-type region 20 are not substantially etched by the removal of dielectric layer 70. A conventional example of such an etch is a plasma etch, using $CHF_3$, $C_2F_6$ and He as active species. As shown in FIG. 2h, both dielectric layer 70 and gate dielectric 62 are removed at location 71, at which the emitter region will be formed.

Figure 2I:
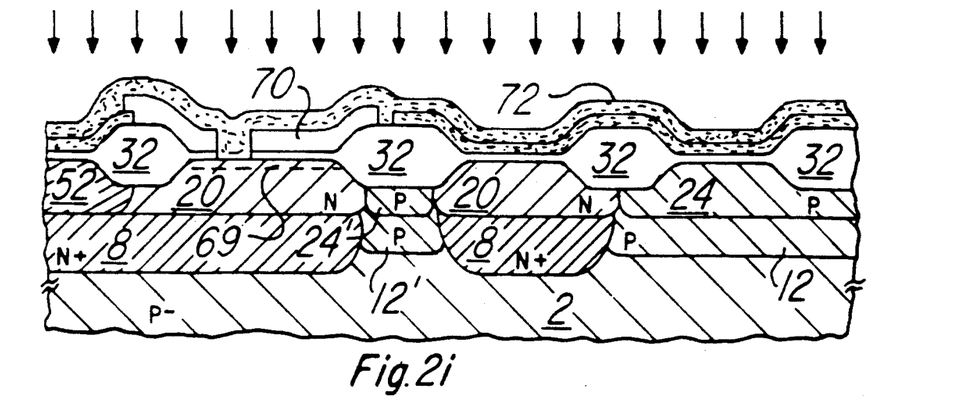

Polysilicon layer 72 is then formed overall to a thickness on the order of 100 to 300 nm, preferably by way of LPCVD, to result in the structure illustrated in FIG. 2i. At the locations at which polysilicon layer 68 still remains, such as over the moat locations at which the MOS transistors 5 and 7 will be formed, the two polysilicon layers 68 and 72 will effectively merge into a single layer (hereinafter referred to as layer 72). At the location 71 of the emitter contact, polysilicon layer 72 will be in contact with n region 20. After deposition of polysilicon layer 72, a blanket n-type implant is performed, to provide dopant thereinto which can diffuse to form emitter region 80 in bipolar transistor 3, and which will increase the conductivity of the gate electrodes 72 in MOS transistors 5 and 7. An example of a preferred method of implanting polysilicon layer 72, wherein a shallow emitter junction is provided while yet providing highly conductive polysilicon emitter electrode, is described in copending application Ser. No. 306,439 filed Feb. 3, 1989, now U.S. Pat. No. 5,047,357, and assigned to Texas Instruments Incorporated.

The above blanket n-type implant method results in all polysilicon structures 72 being heavily n-type doped. It should be noted that if it is desired that some portions of polysilicon layer 72 not be doped n-type, for example if gate electrode 72p for p-channel MOS transistor 5 is to be doped p-type, a masking layer may be provided and the implant of FIG. 2i can be done with portions of layer 72 masked therefrom.

Figure 2J:
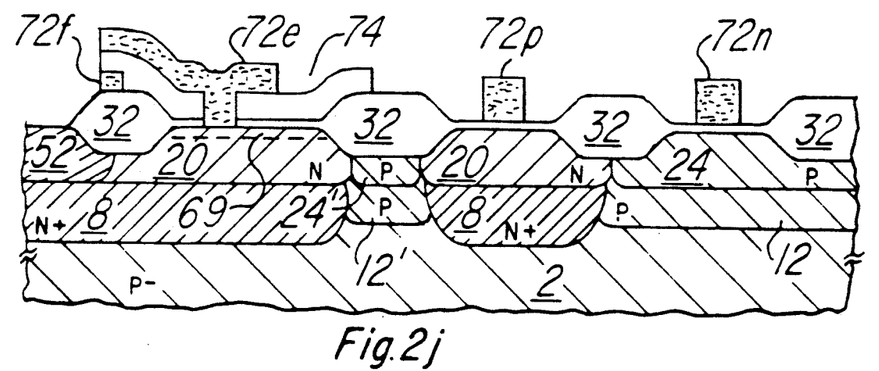

A masking layer (not shown) is then formed over the structure to define the geometries of the gate electrodes of MOS transistors 5 and 7, and of the emitter electrode for bipolar transistor 3. A polysilicon etch is then performed, in a similar manner as described above for the etching of polysilicon layer 68. The resulting structure is shown in FIG. 2j, where emitter electrode 72e, and gate electrodes 72p and 72n are formed in the desired locations. It should also be noted that a filament of polysilicon layer 68, such filament referred to as filament 72f in FIG. 2j, may remain after the polysilicon etch, especially if the etch used is substantially anisotropic. It should be noted that filament 72f may be passivated so as to be electrically harmless, as will be described hereinbelow. Alternatively, a brief isotropic polysilicon etch, for example a conventional wet polysilicon etch, may be done in order to remove filament 72f, if desired.

As described above, sidewall filaments 78, preferably of silicon dioxide, are preferably formed by deposition of silicon dioxide followed by an anisotropic oxide etch. In this embodiment, the anisotropic oxide etch used to form sidewall filaments 78 will also remove dielectric layer 70 and gate dielectric 62 from location 74 in the bipolar moat region. The surface of the intrinsic base region 69 at location 74 will thus be exposed after this etch, so that extrinsic base region 82 can be formed thereat, via ion implantation and diffusion. Ion implantation, for formation of the n-type source/drain regions 86 and for formation of the p-type source/drain regions 84 and extrinsic base region 82, can be formed in the conventional manner, followed by a high temperature anneal in order to diffuse the dopant implanted into the single-crystal silicon, as well as the dopant implanted into emitter electrode 72e, to the desired depths. The resultant transistor is illustrated in FIGS. 1 and 3, such construction described hereinabove relative to these figures.

Figure 4:
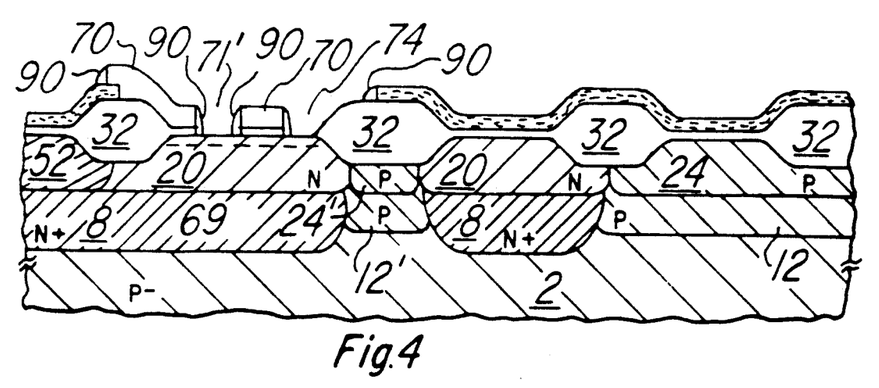
FIG. 4 is a cross-sectional view of a BiCMOS structure according to another embodiment of the invention, at a particular point in its manufacture.

Referring now to FIG. 4, an alternative method for forming emitter electrode 72e will be described. After removal of dielectric layer 70 in all locations except over the intrinsic base region 69, at the point in the process illustrated by FIG. 2h, it may be desirable to narrow the size of emitter opening 71 through dielectric layer 70. This is especially true where the size of eventual emitter region 80 is to be smaller than that which may be formed by conventional lithography and etch processes, especially with a relatively thick (100 nm) dielectric layer 70 to be etched through in forming emitter opening 70. In order to form such a smaller emitter opening (and extrinsic base region 82), sidewall dielectric filaments 90 can be formed on the sides of remaining dielectric layer 70 in bipolar transistor 3. The formation of filaments 90 is performed in the conventional sidewall filament manner, i.e., by the deposition of a material such as silicon dioxide followed by anisotropic etching thereof. FIG. 4 illustrates the formation of filaments 90 on the structure at this point in the fabrication process. The width of emitter opening 71' can thus be reduced from that which could be made by conventional lithographic processing.

After formation of the sidewall filaments 90, the fabrication method according to this alternative embodiment will be completed in the same manner as described above. The resultant transistor 3', illustrated in cross-section in FIG. 5, will have a smaller emitter region 80 and extrinsic base region 82, as compared to that of transistor 3 of FIG. 1. Accordingly, this alternative embodiment is especially applicable when the structure of FIG. 1 is to be scaled downward in size. The ability to perform such scaling is widely desired in the semiconductor processing art.

Figure 5:
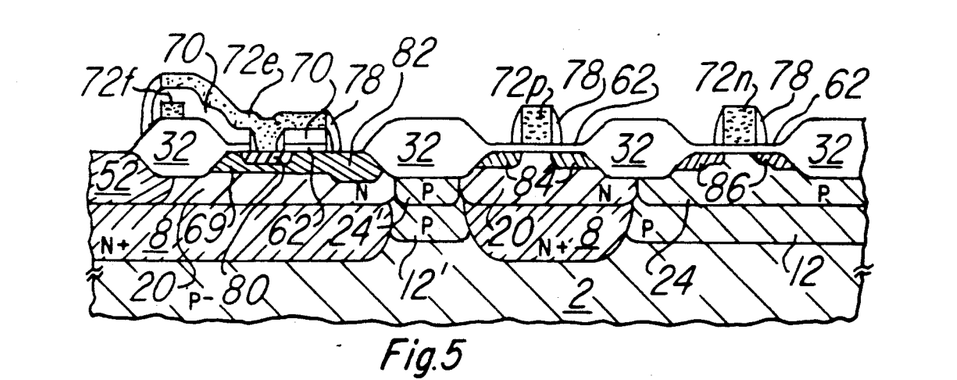
FIG. 5 is a cross-sectional view of the BiCMOS structure of the embodiment of FIG. 4, at a later stage in its manufacture.

Subsequent to the completion of the method described hereinabove, interconnecting metallization is then formed for making contact to the active regions of FIGS. 1 and 5, in the conventional manner, and as described in said copending application Ser. No. 366,224. Individual circuits are then separated from portions of substrate 20, and external connections made thereto by way of wire bonding, direct bump connection, or the like, as is well known in the art. The individual circuits may then be packaged into a dual-in-line package, a chip carrier, or another type of package. An example of such a package is described in U.S. Pat. No. 4,495,376 issued Jan. 22, 1985 and assigned to Texas Instruments Incorporated.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A method for fabricating an integrated circuit, comprising: 'forming isolation structures at a semiconductor surface of a body, said isolation structures defining a bipolar region and a first MOS region, both of a first conductivity type, and a second MOS region of a second conductivity type;

forming an insulating layer abutting said bipolar region, said first MOS region, and said second MOS region;

forming a first conductive layer abutting said insulating layer;

introducing base dopant of said second conductivity type into said bipolar region after formation of said insulating layer;

removing said first conductive layer from said bipolar region;

forming a dielectric layer thereover, said dielectric layer overlying said first conductive layer at said MOS regions and overlying said bipolar region;

removing a selected portion of said dielectric layer to expose a portion of said bipolar region, and to expose said first conductive layer in said MOS regions;

forming a second conductive layer thereover, said second conductive layer in contact with said exposed portion of said bipolar region and in contact with said first conductive layer in said MOS regions;

forming an emitter region at the location at which said second conductive layer is in contact with said bipolar region; and removing selected portions of said second conductive layer in said bipolar region to define an emitter electrode, and selected portions of said first and second conductive layers in said MOS regions to define gate electrodes.

2. The method of claim 1, wherein said step of introducing base dopant is performed after said step of removing said first conductive layer from said bipolar region.

3. The method of claim 1, wherein said step of introducing base dopant is performed prior to said step of removing said first conductive layer from said bipolar region.

4. The method of claim 1, wherein said second conductive layer comprises non-single-crystal silicon.

5. The method of claim 4, wherein said step of forming an emitter region comprises:

introducing dopant of said first conductivity type into said second conductive layer;

heating the structure so that said introduced dopant of said first conductivity type diffuses into said bipolar region.

6. The method of claim 1, wherein said dielectric layer comprises silicon dioxide.

7. The method of claim 6, wherein said step of forming said dielectric layer comprises depositing said silicon dioxide.

8. The method of claim 7, wherein said step of depositing silicon dioxide comprises low pressure chemical vapor deposition by decomposition of TEOS.

9. The method of claim 1, further comprising:
forming a subcollector region of said first conductivity type underlying said bipolar region.

10. The method of claim 1, further comprising:
forming sidewall dielectric filaments adjacent the sides of said emitter electrode and said gate electrodes; and
introducing dopant of said second conductivity type into said bipolar region, at a location aligned with the sidewall filament adjacent said emitter electrode, to form an extrinsic base region.

11. The method of claim 10, wherein said step of introducing dopant of said second conductivity type also introduces dopant of said second conductivity type into said first MOS region at locations aligned with the sidewall filaments adjacent the gate electrode disposed thereover, to form source/drain regions in said first MOS region.

12. The method of claim 1, further comprising:
forming sidewall dielectric filaments adjacent the sides of said dielectric layer after said step of removing selected portions thereof, so that the contact made to said bipolar region by said emitter electrode is reduced in area by the area of said sidewall dielectric filaments.

13. The method of claim 12, wherein said step of forming an emitter region comprises:
introducing dopant of said first conductivity type into said second conductive layer; and
heating the structure so that said dopant of said first conductivity type diffuses into said bipolar region.

14. A method of fabricating an MOS device and a transistor on a semiconductor substrate, said method comprising:
forming a gate dielectric layer abutting said substrate;
depositing a first conductive layer abutting said gate dielectric layer;
patterning said first conductive layer to expose a portion of said gate dielectric layer;
introducing a first conductivity type dopant into selective portions of said substrate through said exposed portion of said gate dielectric layer;
forming a thick dielectric abutting said patterned first conductive layer and said exposed portion of said gate dielectric layer;
patterning said thick dielectric and said gate dielectric layer to expose a portion of said substrate and portions of said patterned first conductive layer;
forming a second conductive layer abutting said exposed portion of said substrate, said patterned thick dielectric, and said exposed portions of said patterned first conductive layer, and
patterning said second conductive layer to transistor electrode and patterning selected portions of said first and said second conductive layers in the MOS region to form a gate electrode.

15. The method of claim 1, wherein said insulating layer is a gate dielectric layer.

* * * * *